United States Patent
Okuaki

(10) Patent No.: US 9,253,926 B2
(45) Date of Patent: Feb. 2, 2016

(54) SERVO AMPLIFIER HAVING COOLING STRUCTURE INCLUDING HEAT SINK

(71) Applicant: FANUC CORPORATION, Yamanashi (JP)

(72) Inventor: Kenichi Okuaki, Yamanashi (JP)

(73) Assignee: Fanuc Corporation, Yamanashi (JP)

( * ) Notice: Subject to any disclaimer, the term of this patent is extended or adjusted under 35 U.S.C. 154(b) by 161 days.

(21) Appl. No.: 14/187,646

(22) Filed: Feb. 24, 2014

(65) Prior Publication Data

US 2014/0240925 A1    Aug. 28, 2014

(30) Foreign Application Priority Data

Feb. 26, 2013  (JP) ................. 2013-035565

(51) Int. Cl.
*H05K 7/20* (2006.01)
*H01L 23/40* (2006.01)
*H01L 23/367* (2006.01)
*H01L 23/427* (2006.01)

(52) U.S. Cl.
CPC ........ *H05K 7/20409* (2013.01); *H01L 23/4006* (2013.01); *H01L 23/367* (2013.01); *H01L 23/427* (2013.01); *H01L 2023/405* (2013.01); *H01L 2924/0002* (2013.01)

(58) Field of Classification Search
CPC ........... H05K 7/20409; H01L 23/4006; H01L 2924/0002; H01L 23/367; H01L 23/427; H01L 2023/405
USPC ........................... 361/688–723; 165/80.3, 185
See application file for complete search history.

(56) References Cited

U.S. PATENT DOCUMENTS

| | | | | |
|---|---|---|---|---|
| 5,508,908 | A  * | 4/1996  | Kazama | H05K 7/20936 165/80.3 |
| 2005/0280997 | A1* | 12/2005 | Maeda | H01L 23/367 361/703 |
| 2010/0053898 | A1* | 3/2010  | Isomoto | H05K 7/20918 361/697 |
| 2012/0250254 | A1* | 10/2012 | Kojyo | H05K 7/20918 361/692 |
| 2015/0146374 | A1* | 5/2015  | Okuaki | H05K 7/20909 361/690 |

FOREIGN PATENT DOCUMENTS

| | | | | |
|---|---|---|---|---|
| JP | 11-145637 | A  * | 5/1999 | ............... H05K 7/20 |
| JP | 11145637  | A    | 5/1999 | |
| JP | 2009-111310 | A  * | 5/2009 | ............... H05K 7/20 |
| JP | 2009111310 | A  | 5/2009 | |
| JP | 2009-164351 | A  * | 7/2009 | ............... H05K 7/20 |
| JP | 2009164351 | A  | 7/2009 | |

* cited by examiner

*Primary Examiner* — Anthony Haughton
*Assistant Examiner* — Yahya Ahmad
(74) *Attorney, Agent, or Firm* — Fredrikson & Byron P.A.

(57) ABSTRACT

A servo amplifier includes a housing, a heat source arranged in the housing, and a heat dissipating structure including a heat sink arranged in the housing and thermally connected to the heat source. The heat sink has heat dissipating fins extending from at least a portion of a surface of the heat sink, other than a connecting face thermally connected to the heat source. The at least a portion of the surface of the heat sink, other than the connecting face, is thermally connected to a surface of the housing.

8 Claims, 12 Drawing Sheets

SERVO AMPLIFIER HAVING COOLING STRUCTURE INCLUDING HEAT SINK

BACKGROUND OF THE INVENTION

1. Field of the Invention

The present invention relates to a servo amplifier having a cooling structure including a heat sink.

2. Description of the Related Art

A common servo amplifier is provided with a cooling means for cooling a heat source in a servo amplifier, such as a heat sink and a fan motor. In order to enhance the cooling effect, surface area or volume of the heat sink is increased, rotational speed of the fan motor is increased, or a heat conducting member is used to conduct heat to a cooling structure arranged at a position distant from the heat source.

JP-A-2009-111310 discloses a cooing method for cooling electronic equipment by interposing a heat conducting member between a heat source and a metallic cabinet for accommodating the electronic equipment.

In order to increase the surface area or volume of the heat sink, it is necessary to provide a sufficiently large space around the heat source. However, space available in the housing of the servo amplifier is often predetermined and limited. Therefore, improvements in a heat dissipating effect of the heat sink by its design change are limited. In the case where a rotational speed of the fan motor is increased to enhance the heat dissipating effect, life of the fan motor tends to be shortened as the rotational speed is higher.

In the case where the technique disclosed in JP-A-2009-111310, i.e., conducting heat from a heat source to a cooling structure arranged distant from the heat source through a heat conducting member, is applied to a servo amplifier including a power semiconductor which produces a large amount of heat generation, since a distance between the heat source and a cabinet is relatively large, it is difficult to achieve a sufficient cooling effect. In this case, it is necessary to provide an expensive cooling means such as a heat pipe as a heat conducting member. This leads to an increase in cost of the servo amplifier.

Accordingly, there is a need for an inexpensive servo amplifier including a cooling structure having an efficient heat dissipation effect.

SUMMARY OF THE INVENTION

According to a first aspect of the present disclosure, a servo amplifier comprising: a housing; a heat source arranged in the housing; and a heat dissipating structure comprising a heat sink arranged in the housing and thermally connected to the heat source, wherein the heat sink comprises heat dissipating fins extending from at least a portion of a surface of the heat sink, other than a connecting face which is thermally connected to the heat source, and wherein the at least a portion of the surface of the heat sink, other than the connecting face, is thermally connected to a surface of the housing, is provided.

According to a second aspect of the present disclosure, in the servo amplifier according to the first aspect, a first connecting face of the heat sink, which is thermally connected to the housing, is formed by a surface of the heat dissipating fin facing a surface of the housing, and arranged so as to extend perpendicular with respect to a second connecting face of the heat sink, which is thermally connected to the heat source.

According to a third aspect of the present disclosure, in the servo amplifier according to the second aspect, a connecting face of the housing, which is thermally connected to the heat sink, is formed by an inner face of the housing, and the first connecting face of the heat sink and the connecting face of the housing extend parallel to each other.

According to a fourth aspect of the present disclosure, in the servo amplifier according to the first aspect, the first connecting face of the heat sink, which is thermally connected to the housing, is formed by a surface of the heat dissipating fin facing a surface of the housing, and arranged so as to extend parallel to a second connecting face of the heat sink, which is thermally connected to the heat source.

According to a fifth aspect of the present disclosure, in the servo amplifier according to the fourth aspect, a connecting face of the housing, which is thermally connected to the heat sink, is formed by an inner face of the housing, and the first connecting face of the heat sink and the connecting face of the housing extend perpendicular to each other.

According to a sixth aspect of the present disclosure, in the servo amplifier according to one of the first to fifth aspects, a heat conducting member, which is different from the heat sink and the housing, is interposed between the heat sink and the housing.

According to a seventh aspect of the present disclosure, in the servo amplifier according to one of the first to fifth aspects, the heat sink and the housing are directly connected to each other.

According to an eighth aspect of the present disclosure, in the servo amplifier according to one of the first to seventh aspects, at least one of the heat sink and the housing has a protruding portion which protrudes to the other, and the heat sink and the housing are thermally connected to each other through the protruding portion.

These and other objects, features and advantages of the present invention will become more apparent in light of the detailed description of exemplary embodiments thereof as illustrated by the drawings.

DETAILED DESCRIPTION OF THE INVENTION

Referring to the accompanying drawings, embodiments of the present invention will be explained below. In order to help understand the present invention, constituent elements of the illustrated embodiments may be modified in size in relation to one another as necessary.

Figure 1:
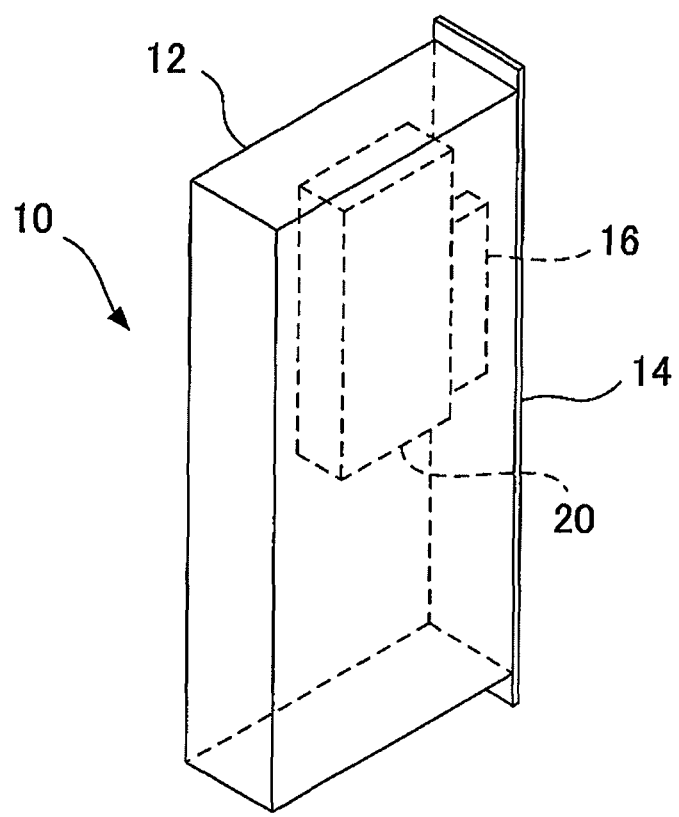
FIG. 1 is a perspective view showing a basic structure of a servo amplifier according to the present invention.

FIG. 1 is a perspective view showing a basic structure of a servo amplifier 10 according to the present invention. The servo amplifier 10 includes a housing formed from a first housing part 12 and a second housing part 14, and a heat source (not shown), such as a power semiconductor, which is accommodated in the housing. The first housing part 12 has a hollow rectangular parallelepiped shape which is open on a surface facing the second housing part 14. The second housing part 14 is a plate member and attached to the first housing part 12 so as to cover an opening of the first housing part 12. The second housing part 14 is sized larger than the opening of the first housing part 12 and used as an attaching face for screwing when the servo amplifier 10 is attached to a support structure (not shown). However, the shape and structure of the housing are not limited to the specific example disclosed in the present specification. For example, as opposed to the embodiment described below in which the housing of the servo amplifier is formed from the first housing part 12 and the second housing part 14, a housing integrally formed may be used as well.

The servo amplifier 10 includes a heat dissipating structure for dissipating heat generated from the heat source. The heat dissipating structure includes a heat sink 20 and a heat conducting part 16 interposed between the heat sink 20 and the second housing part 14. Although it is not shown in FIG. 1, the heat sink 20 includes heat dissipating fins extending from at least a portion of a surface other than a connecting surface connected to the heat source. With the heat dissipating structure of the servo amplifier 10, heat generated from the heat source is dissipated by the heat sink 20, and at the same time conducted to the housing (the second housing part 14) of the servo amplifier 10 through the heat sink 20 and the heat conducting part 16. This arrangement makes it possible to achieve a cooling effect by the heat sink 20 in the vicinity of the heat source, as well as a cooling effect by the housing arranged distant from the heat source.

Figure 2A:
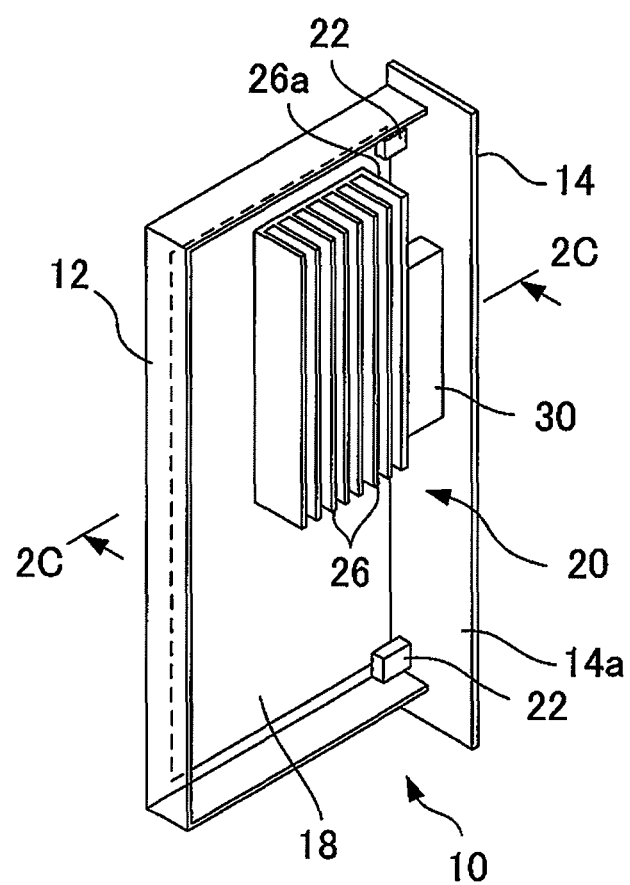
FIG. 2A is a perspective view showing a servo amplifier according to a first embodiment of the present invention.
Figure 2B:
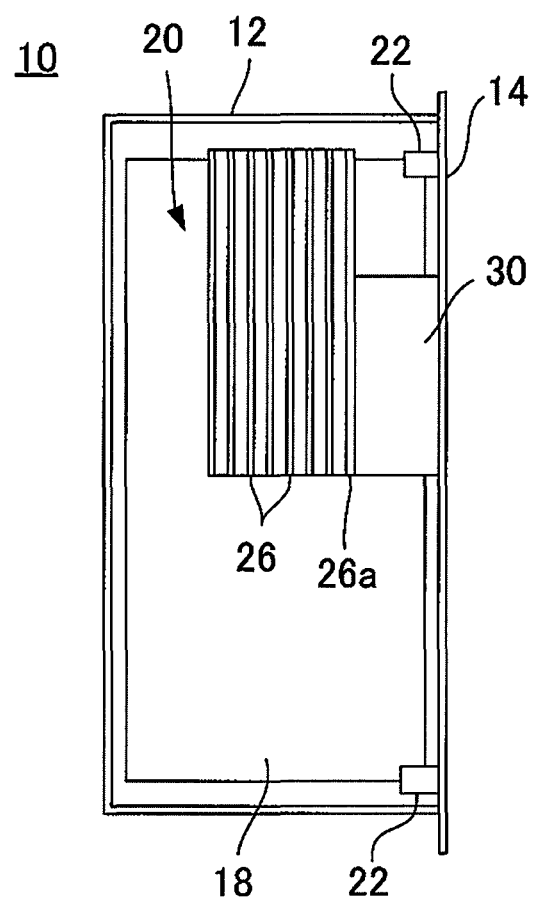
FIG. 2B is a front view of the servo amplifier shown in FIG. 2A.
Figure 2C:
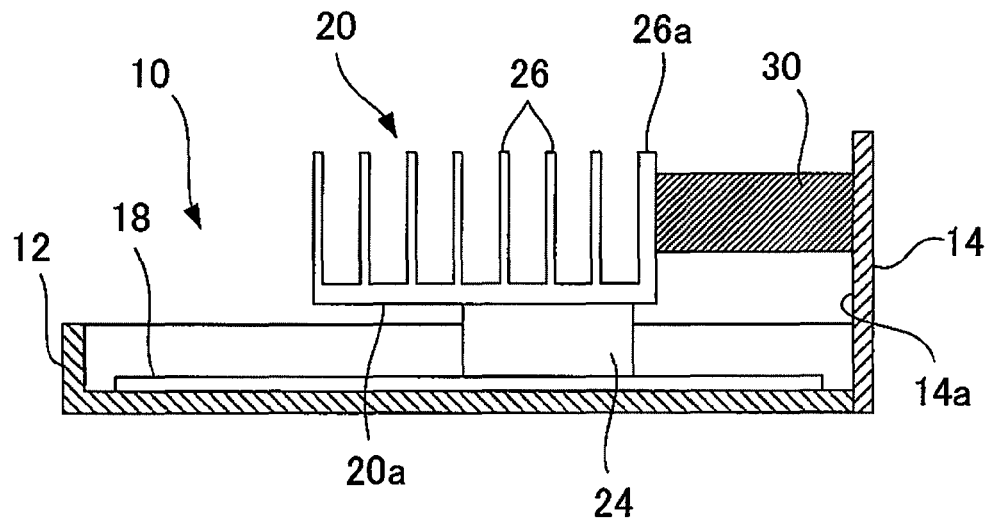
FIG. 2C is a sectional view of the servo amplifier shown in FIG. 2A.

FIG. 2A is a perspective view showing a servo amplifier 10 of a first embodiment of the present invention. FIG. 2B is a front view of the servo amplifier 10 shown in FIG. 2A. FIG. 2C is a sectional view of the servo amplifier 10 shown in FIG. 2A. In FIGS. 2A, 2B and 2C, a portion of the first housing part 12 is cut off so as to show the inner structure of the servo amplifier 10.

The first housing part 12 is provided with a printed board 18 on an inner face. The housing is formed with protrusions 22 for attaching the printed board 18. A power semiconductor 24 is mounted on the printed board 18 (FIG. 2C).

As described above in relation to FIG. 1, the heat sink 20 has a plurality of cooling fins 26. As shown in FIG. 2C, the cooling fins 26 extend perpendicularly to a connecting face 20a of the heat sink 20 connected to the power semiconductor 24. A heat conducting member 30 is connected to a side of a cooling fin 26a arranged on the most right side among the cooling fins 26 in FIG. 2C, or in other words, arranged to face the second housing part 14. The heat sink 20 is made of a material having high heat conductivity, such as aluminum, copper or alloy thereof. The cooling fin 26a arranged to face the second housing member 14 may have a thickness greater than those of other cooling fins 26. In this way, a quantity of heat conducted from the power semiconductor 24 to the second housing part 14 through the heat sink 20 is increased. Therefore, the heat dissipating effect by the housing of the servo amplifier 10 can be enhanced.

The connecting face 20a of the heat sink 20, which acts as a heat conducting path from the power semiconductor 24, is preferably formed perpendicularly with respect to a narrower face of the housing of the servo amplifier 10. In the illustrated embodiment, the connecting face 20a of the heat sink 20 is formed perpendicularly with respect to a wall face 14a of the second housing part 14. In other words, the connecting face 20a extends parallel to the surface of the first housing part 12. According to this arrangement, the size of the connecting face 20a of the heat sink 20 and the thickness of the cooling fins 26 may be determined as necessary, so as to achieve a sufficient heat dissipation effect through the surface of the heat sink 20. On the other hand, in the case where the connecting face 20a is arranged parallel with respect to the narrower surface (the wall face 14a of the second housing part 14) of the housing, a contact area between the heat sink 20 and the power semiconductor 24 is decreased. Therefore, it is necessary to take a countermeasure, such as extending the length of the fins. When the length of the fins exceeds an appropriate amount, heat can be no longer conducted to the ends of the fins. In this case, efficiency in heat dissipation is deteriorated.

The heat conducting member 30 is arranged between the cooling fin 26a and the second housing part 14. According to this arrangement, the heat sink 20 and the second housing part 14 are thermally connected to each other through the heat conducting member 30. The heat conducting member 30 is made of a material having high heat conductivity, such as aluminum, copper or alloy thereof. The heat conducting member 30 is connected to the heat sink 20 and the second housing part 14, respectively, by way of any known means, such as by screwing. In order to prevent a gap from being formed between the respective parts, heat conductive grease may be applied therebetween.

According to servo amplifier configured as described above, a first heat dissipating effect can be achieved through the surface of the heat sink arranged near the heat source. At the same time, heat is conducted to the housing through the heat sink and the heat conducting member. Therefore, a second heat dissipating effect can be achieved through the housing surface. Accordingly, even in the case where the space inside the housing of the servo amplifier is limited, a highly reliable and efficient heat dissipating effect can be provided. In addition, since it is unnecessary to use an expensive cooling means such as a heat pipe, an inexpensive servo amplifier can be provided.

In particular, according to the first embodiment, even in the case where the heat sink cannot be arranged near the wall face of the housing due to restricted arrangement of the printed board and the heat source, heat can be still conducted between the heat sink and the housing through the heat conducting member, which is different from the heat sink and the housing. The heat conducting member different from the heat sink and the housing can be easily modified in shape, corresponding to the shapes of the parts arranged around the heat conducting member. Therefore, it is possible to produce the heat conducting member at low cost. Further, the shape of the heat conducting member can be easily modified so as to facilitate a process of connecting the heat conducting member to the heat sink and the housing, respectively.

Other embodiments of the present invention will be described below. Matters which have already been described above will be omitted in the following explanation. The same or corresponding constituent elements are designated with the same referential numerals.

Figure 3A:
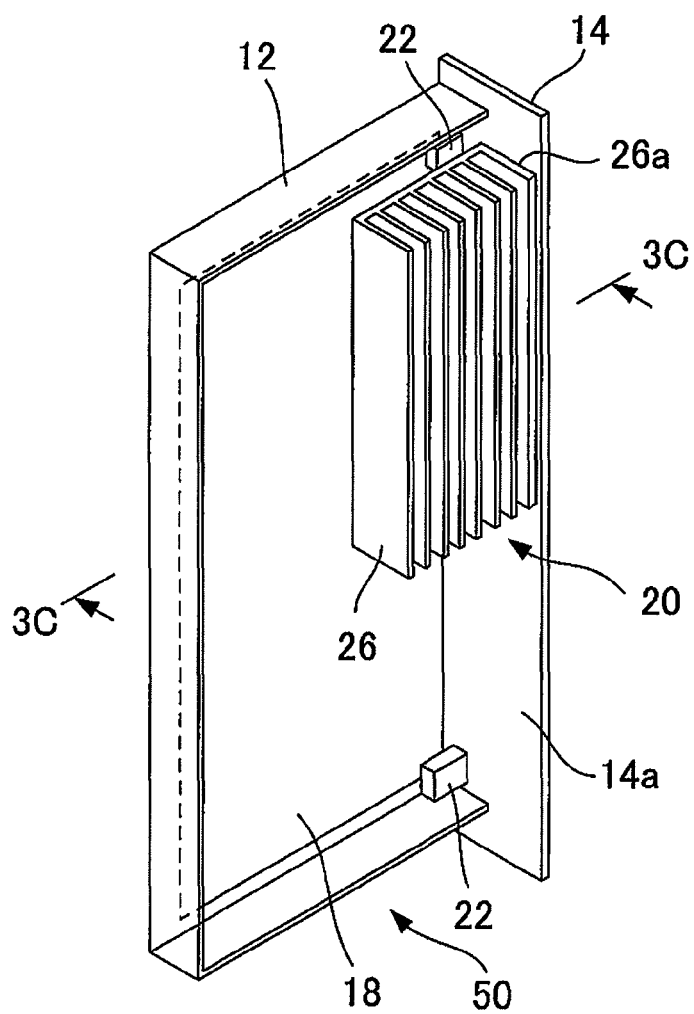
FIG. 3A is a perspective view showing a servo amplifier according to a second embodiment of the present invention.
Figure 3B:
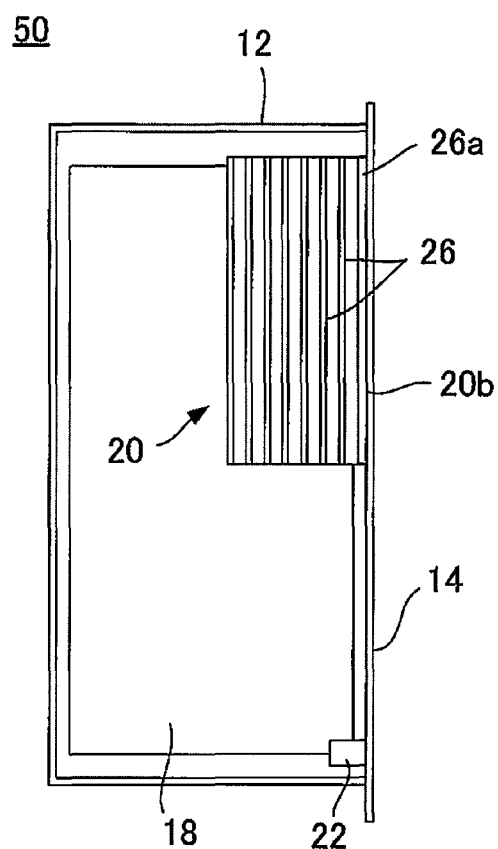
FIG. 3B is a front view of the servo amplifier shown in FIG. 3A.
Figure 3C:
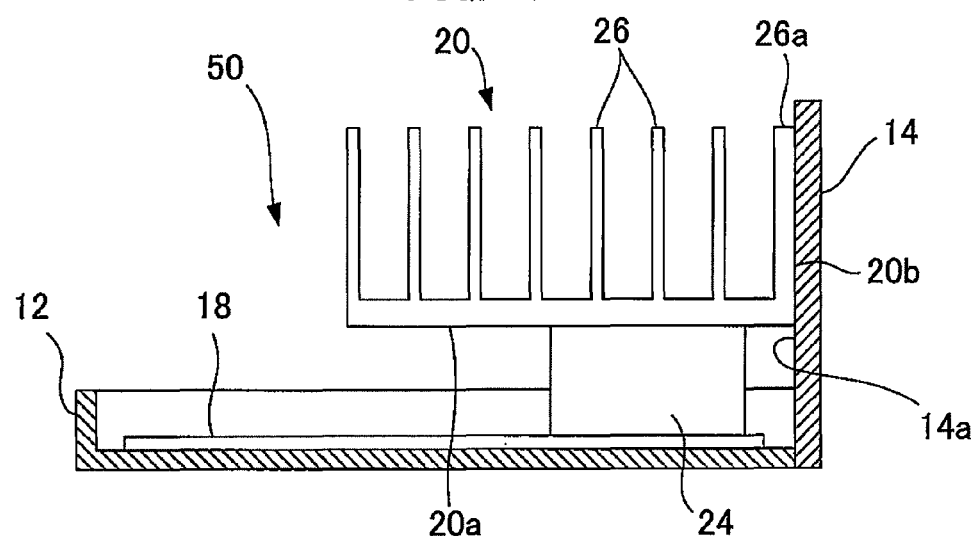
FIG. 3C is a sectional view of the servo amplifier shown in FIG. 3A.

FIG. 3A is a perspective view showing a servo amplifier 50 according to a second embodiment of the present invention. FIG. 3B is a front view of the servo amplifier 50 shown in FIG. 3A. FIG. 3C is a sectional view of the servo amplifier 50 shown in FIG. 3A. In this embodiment, the heat sink 20 of the servo amplifier 50 is directly connected to the wall face 14*a* of the second housing part 14. Accordingly, a side of the cooling fin 26*a* facing the second housing part 14 acts as a connecting face 20*b* of the heat sink 20 which is connected to the second housing part 14. According to this arrangement, it is possible to omit a separate heat conducting member in the first embodiment. Therefore, a process for mounting the heat conducting member is unnecessary, and therefore, production cost can be reduced.

Figure 4:
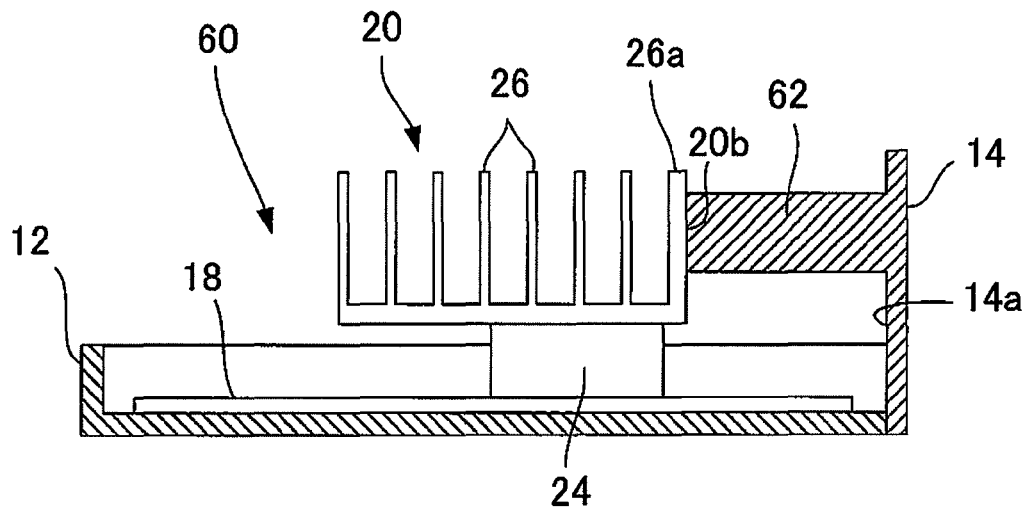
FIG. 4 is a sectional view showing a servo amplifier according to a third embodiment of the present invention.

FIG. 4 is a sectional view showing a servo amplifier 60 of a third embodiment of the present invention. A perspective view and front view of the servo amplifier 60 of the present embodiment are omitted, since they are the same as FIGS. 2A and 2B. In the present embodiment, the second housing part 14 is formed with a protruding portion 62 which protrudes from the wall face 14*a* toward the heat sink 20. This protruding portion 62 is connected to the connecting face 20*b* of the heat sink 20. The heat sink 20 and the protruding portion 62 are connected to each other, for example, by screwing. According to this arrangement, heat generated from the power semiconductor 24 can be conducted to the second housing part 14 through the heat sink 20 without an additional element such as the heat conducting member in the first embodiment. Accordingly, a process for mounting the heat conducting member is unnecessary. Therefore, production cost can be reduced.

Figure 5A:
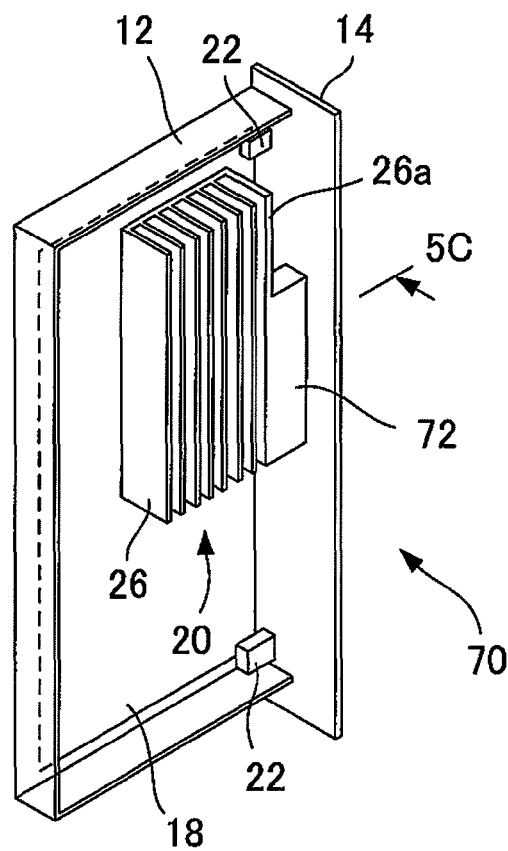
FIG. 5A is a perspective view showing a servo amplifier according to a fourth embodiment of the present invention.
Figure 5B:
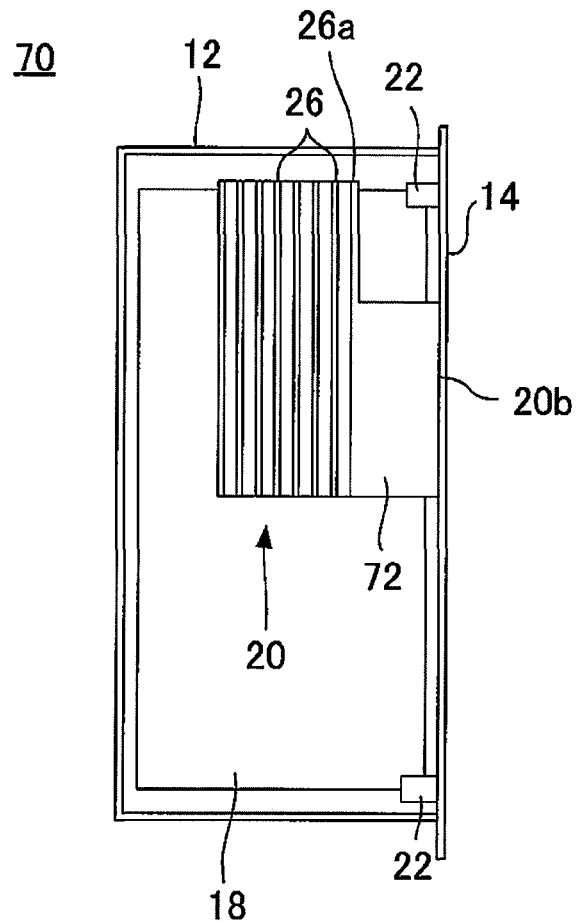
FIG. 5B is a front view of the servo amplifier shown in FIG. 5A.
Figure 5C:
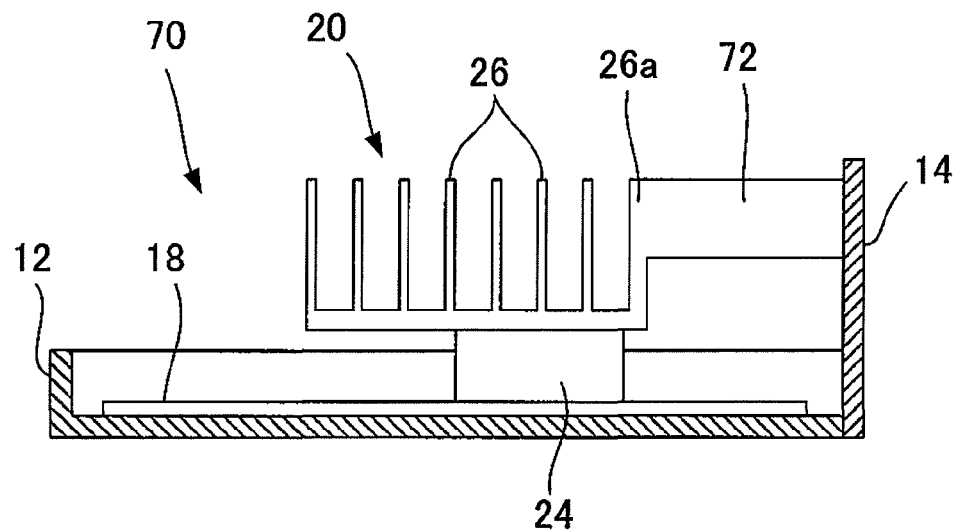
FIG. 5C is a sectional view of the servo amplifier shown in FIG. 5A.

FIG. 5A is a perspective view showing a servo amplifier 70 according to a fourth embodiment of the present invention. FIG. 5B is a front view of the servo amplifier 70 shown in FIG. 5A. FIG. 5C is a sectional view of the servo amplifier 70 shown in FIG. 5A. In the present embodiment, the heat sink 20 includes a protruding portion 72 which protrudes toward the second housing part 14 from a portion of the side of the cooling fin 26*a* facing the second housing part 14. A face of the protruding portion 72 facing the second housing part 14 acts as a connecting face 20*b* which connects the heat sink 20 with the second housing part 14. According to this arrangement, the heat conducting member is unnecessary unlike the first embodiment. Therefore, the assembling process can be simplified and the production cost can be reduced.

Figure 6A:
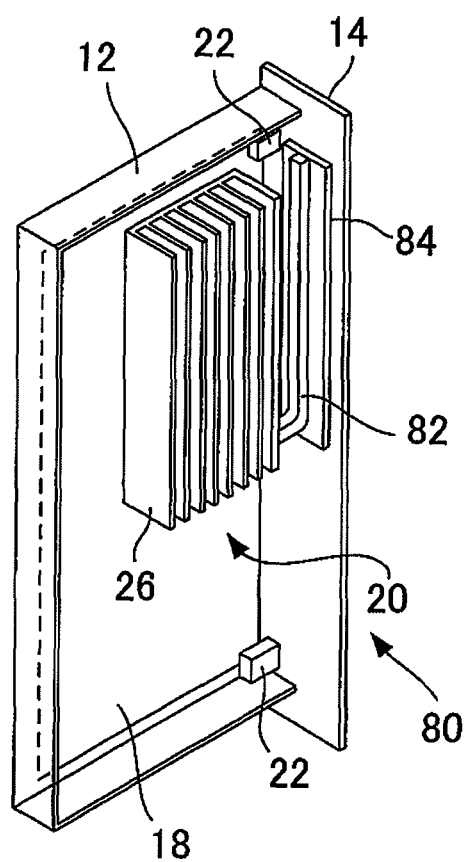
FIG. 6A is a perspective view showing a servo amplifier according to a fifth embodiment of the present invention.
Figure 6B:
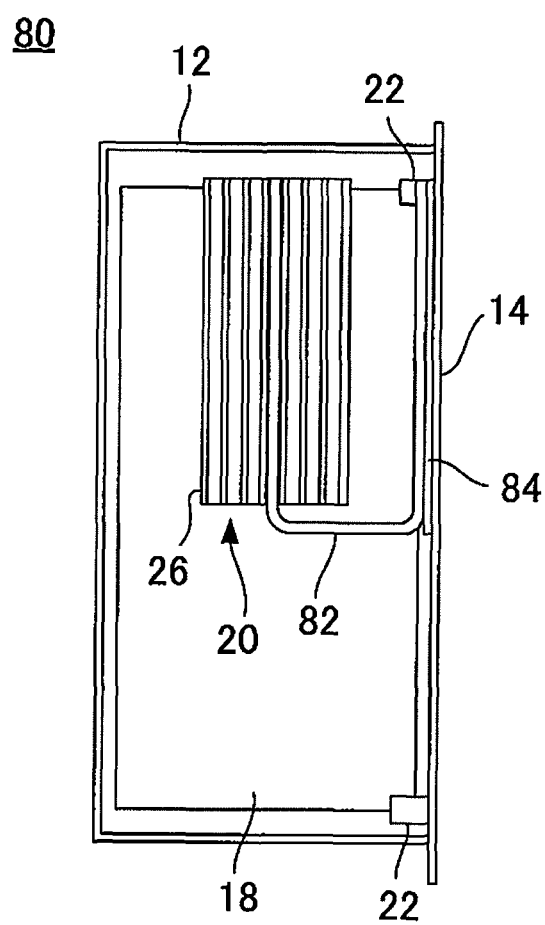
FIG. 6B is a front view of the servo amplifier shown in FIG. 6A.
Figure 6C:
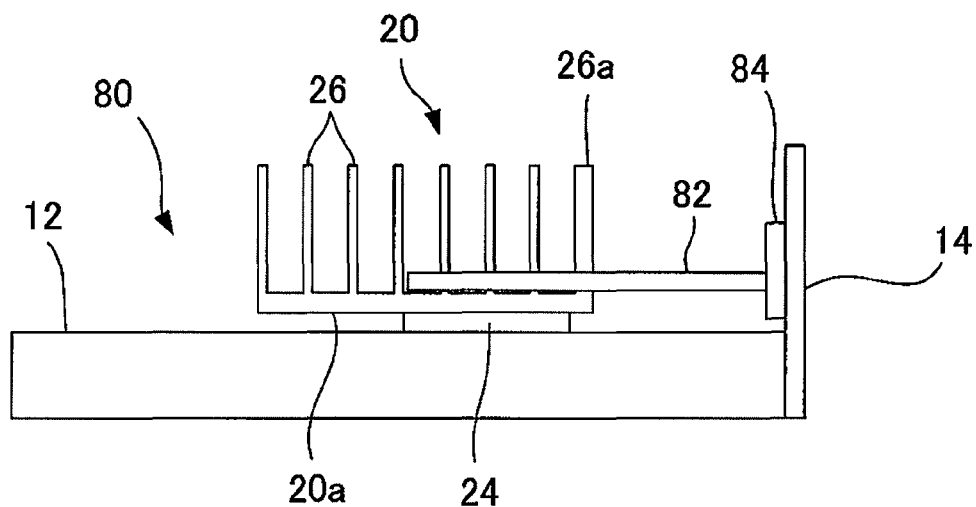
FIG. 6C is a bottom view showing the servo amplifier shown in FIG. 6A.

FIG. 6A is a perspective view showing a servo amplifier 80 according to a fifth embodiment of the present invention. FIG. 6B is a front view of the servo amplifier 80 shown in FIG. 6A. FIG. 6C is a bottom view showing the servo amplifier 80 shown in FIG. 6A. In the present embodiment, the heat sink 20 and the second housing part 14 are thermally connected to each other by a heat pipe 82. More specifically, the heat pipe 82 is mounted on the wall face 14*a* of the second housing part 14 through a heat receiving block 84. This arrangement allows heat generated from the power semiconductor 24 to be conducted to the second housing part 14 through the heat pipe 82.

Accordingly, in the case where it is necessary to enhance the heat dissipating effect of the housing, the heat pipe may be used as a heat conducting member for thermally connecting the heat sink to the housing. Alternatively, instead of the heat pipe, a heat conducting member made of carbon fiber may also be used, whose heat conductivity is greater than copper.

Figure 7A:
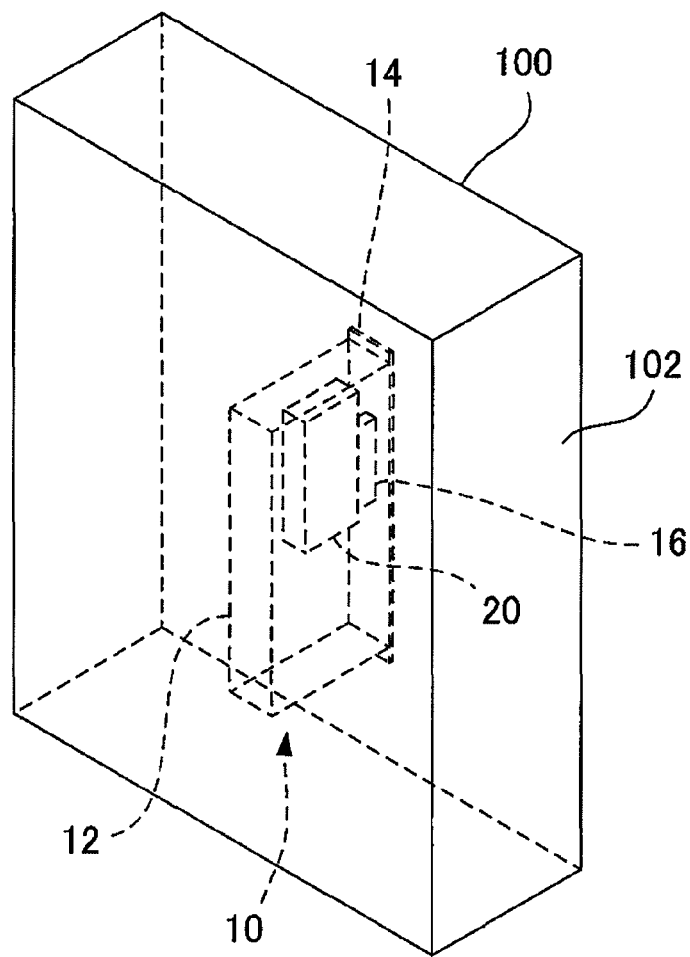
FIG. 7A is a perspective view showing a cabinet on which the servo amplifier according to the present invention is mounted.
Figure 7B:
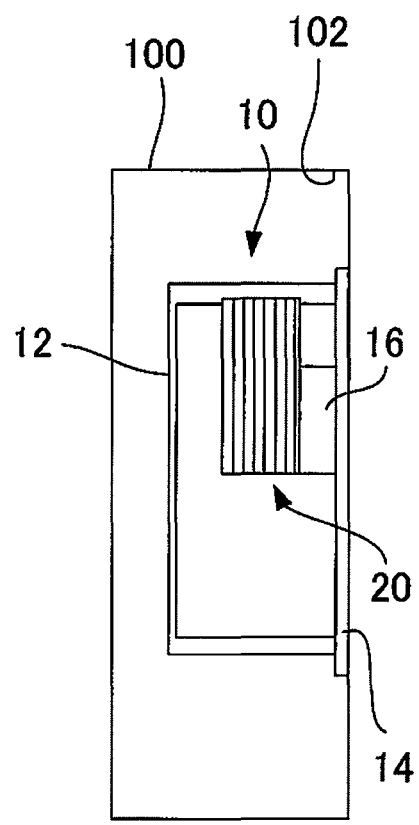
FIG. 7B is a side view showing the cabinet shown in FIG. 7A.

FIG. 7A is a perspective view showing a cabinet 100 on which the servo amplifier 10 of the present invention is mounted. FIG. 7B is a side view showing the cabinet 100 shown in FIG. 7A. The servo amplifier 10 shown in FIG. 7A by a dashed line is accommodated in a housing 102 of the cabinet 100. The second housing part 14 of the servo amplifier 10 is attached to an inner wall face of the housing 102 of the cabinet 100 by screwing. According to this arrangement, heat generated from the heat source is conducted to the housing 102 of the cabinet 100 through the heat sink 20, the heat conducting part 16 and the second housing part 14. Therefore, heat can be also dissipated through the surface of the housing 102 of the cabinet 100.

Figure 8:
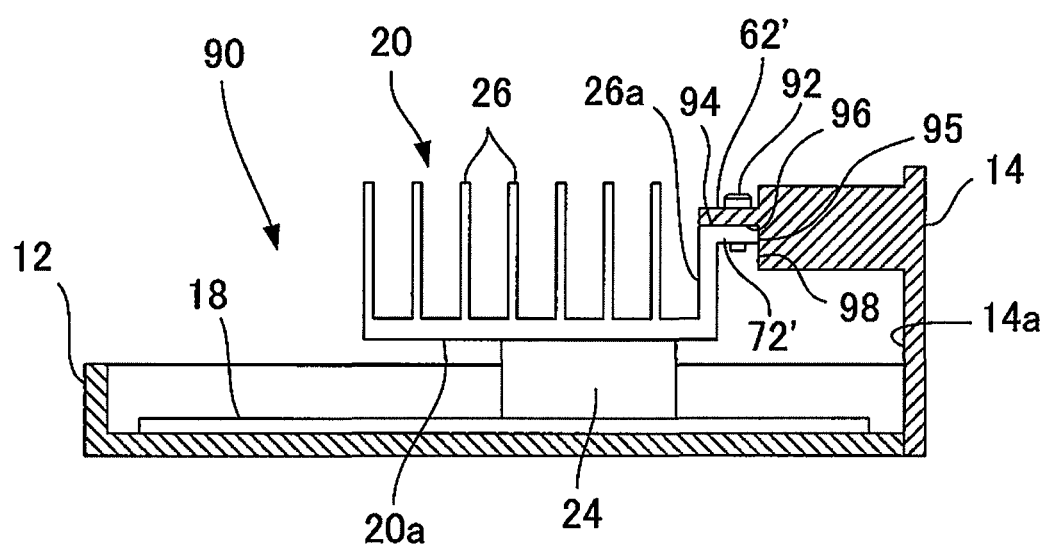
FIG. 8 is a sectional view showing a servo amplifier according to a variant of the present invention.

In relation to FIGS. 4 and 5A to 5C, the examples are described, in which a protruding portion is provided to protrude from one of the second housing part and the heat sink toward the other. However, both the second housing part and the heat sink may have protruding portions which protrude toward each other. FIG. 8 is a sectional view showing a servo amplifier 90 according to this variant. In this case, a protruding portion 62' protruding from the second housing part 14 and a protruding portion 72' protruding from the heat sink 20 are connected to each other by any known fixing means, such as a screw 92. This allows the heat sink 20 and the second housing part 14 to be thermally connected to each other. Specifically, the protruding portion 72' of the heat sink 20 is connected, on a first surface 94 extending parallel to the connecting face 20*a* connected to the power semiconductor 24, to a second surface 96 of the protruding portion 62' of the second housing part 14. Further, the protruding portion 72' of the heat sink 20 is connected, on a third surface 95 extending perpendicularly with respect to the first surface 94, to a fourth surface 98 of the protruding portion 62' of the second housing part 14. According to this arrangement, heat conducted from the heat sink 20 to the second housing part 14 passes through a first path between the first surface 94 and the second surface 96, and a second path between the third surface 95 and the fourth surface 98. Therefore, the heat dissipating effect can be enhanced. Alternatively, a gap may be formed between the third surface 95 and the fourth surface 98. In this case, the second path is not formed. Further, in an alternative variant, a separate heat conducting member may be interposed between the above-described protruding portions 62' and 72'.

According to the present invention, with the heat sink arranged in space near the heat source, a first heat dissipating effect can be obtained through the surface of the heat sink. Further, with the thermal connection between the heat sink and the housing, a second heat dissipating effect can be obtained through the surface of the housing of the servo amplifier. In addition, a third heat dissipating effect may also be obtained as necessary, through the surface of the supporting structure for supporting the servo amplifier, such as, the above-described cabinet. Accordingly, even when the space in the housing is limited, it is possible to achieve a highly reliable and efficient heat dissipating effect. Further, since an expensive cooling means such as a heat pipe can be omitted, it is possible to reduce the cost.

There is no need for a fan motor in connection with the present invention. However, even if the fan motor is provided, it is advantageous that a rotational speed of the fan motor can be lowered. Accordingly, it is possible to prevent a decrease in the life of the fan motor, which may be due to increased rotational speed. Accordingly, the reliability can be improved. Furthermore, since it is unnecessary to provide a cooling structural body at a position distant from the heat source, the servo amplifier can be downsized. Even in the case where a cooling structural body is separately provided, it is possible to employ an inexpensive heat conducting member. Therefore, the cost can be reduced.

EFFECT OF THE INVENTION

According to the servo amplifier configured as described above, heat generated from the heat source is dissipated through the heat sink having fins arranged near the heat source, and further conducted to the housing of the servo amplifier through the heat sink so as to allow the heat to be also dissipated through the surface of the housing. Therefore, it is possible to provide an inexpensive servo amplifier having a cooling structure which achieves an efficient heat dissipating effect.

Although various embodiments and variants of the present invention have been described above, it is obvious for a person skilled in the art that the intended functions and effects can also be realized by other embodiments and variants. In particular, it is possible to omit or replace a constituent element of the embodiments and variants, or additionally provide a known means, without departing from the scope of the present invention. Further, it is obvious for a person skilled in the art that the present invention can be implemented by any combination of features of the embodiments either explicitly or implicitly disclosed herein.

What is claimed is:

1. A servo amplifier comprising:
   a housing;
   a heat source arranged in the housing; and
   a heat dissipating structure comprising a heat sink arranged in the housing and thermally connected to the heat source,
   wherein the heat source is mounted on a printed board which is attached to the housing via a protrusion formed on an inner face of the housing,
   wherein the heat sink comprises heat dissipating fins extending from at least a portion of a surface of the heat sink, other than a second connecting face which is thermally connected to the heat source, and
   wherein a first connecting face of the heat sink different from the second connecting face is thermally connected to an inner face of the housing,
   wherein one of the heat dissipating fins having the first connecting face has a thickness larger than the other heat dissipating fins.

2. The servo amplifier according to claim 1, wherein the first connecting face of the heat sink, which is thermally connected to the housing, is formed by a surface of the heat dissipating fin facing a surface of the housing, and arranged so as to extend perpendicular with respect to the second connecting face of the heat sink, which is thermally connected to the heat source.

3. The servo amplifier according to claim 2,
   wherein the first connecting face of the heat sink and the inner face of the housing extend parallel to each other.

4. The servo amplifier according to claim 1, wherein the first connecting face of the heat sink, which is thermally connected to the housing, is formed by a surface of the heat dissipating fin facing a surface of the housing, and arranged so as to extend parallel to the second connecting face of the heat sink, which is thermally connected to the heat source.

5. The servo amplifier according to claim 4,
   wherein the heat sink has a third connecting face extending perpendicular to the first connecting face, and
   wherein the housing is thermally connected to the first connecting face and the third connecting face of the heat sink, respectively.

6. The servo amplifier according to claim 1, wherein a heat conducting member, which is different from the heat sink and the housing, is interposed between the heat sink and the housing.

7. The servo amplifier according to claim 1, wherein the heat sink and the housing are directly connected to each other.

8. The servo amplifier according to claim 1, wherein at least one of the heat sink and the housing has a protruding portion which protrudes to the other, and the heat sink and the housing are thermally connected to each other through the protruding portion.

* * * * *